(12) United States Patent
Makikawa et al.

(10) Patent No.: US 8,753,538 B2
(45) Date of Patent: Jun. 17, 2014

(54) OXIDE AND MAGNETO-OPTICAL DEVICE

(75) Inventors: Shinji Makikawa, Annaka (JP); Toshiaki Watanabe, Annaka (JP); Akio Yamanaka, Sapporo (JP); Hirotaka Naruse, Kitahiroshima (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 198 days.

(21) Appl. No.: 13/055,608

(22) PCT Filed: Jun. 4, 2010

(86) PCT No.: PCT/JP2010/059514
§ 371 (c)(1),
(2), (4) Date: Feb. 16, 2011

(87) PCT Pub. No.: WO2010/143593
PCT Pub. Date: Dec. 16, 2010

(65) Prior Publication Data
US 2011/0133111 A1 Jun. 9, 2011

(30) Foreign Application Priority Data
Jun. 9, 2009 (JP) ................................ 2009-138473

(51) Int. Cl.
*C09K 11/08* (2006.01)
*C09K 11/02* (2006.01)
(52) U.S. Cl.
USPC .................................................. 252/301.4 R
(58) Field of Classification Search
USPC ........ 252/301.4 R, 301.4 F; 359/796; 501/94, 501/152; 423/263; 117/945, 947
See application file for complete search history.

(56) References Cited

U.S. PATENT DOCUMENTS

| | | | | |
|---|---|---|---|---|
| 3,602,575 A * | 8/1971 | Young | ...................... | 359/484.03 |
| 5,493,984 A | 2/1996 | Miyazawa et al. | | |
| 7,280,341 B2 * | 10/2007 | Maeda et al. | .................. | 361/234 |
| 2007/0045555 A1 * | 3/2007 | Fu | ............................. | 250/370.11 |
| 2008/0094734 A1 * | 4/2008 | Zimmer et al. | ............... | 359/796 |
| 2011/0129179 A1 * | 6/2011 | Jiang | ............................... | 385/11 |

FOREIGN PATENT DOCUMENTS

| | | |
|---|---|---|
| EP | 1 901 262 A1 | 3/2008 |
| JP | 7-89797 A | 4/1995 |
| JP | 8-12498 A | 1/1996 |
| JP | 9-235547 A | 9/1997 |
| JP | 10-297933 A | 11/1998 |

(Continued)

OTHER PUBLICATIONS

Haugsrud et al., "Proton conductivity of Ca-doped Tb2O3," Solid State Ionics, vol. 176, pp. 2957-2961, 2005.

(Continued)

*Primary Examiner* — Emily Le
*Assistant Examiner* — Lynne Edmondson
(74) *Attorney, Agent, or Firm* — Birch, Stewart, Kolasch & Birch, LLP

(57) ABSTRACT

An oxide is provided that contains the oxide represented by Formula (I) as the main component thereof, that has a Verdet constant at a wavelength of 1.06 μm of at least 0.18 min/ (Oe·cm), and that has a transmittance at a wavelength of 1.06 μm and for an optical length of 3 mm of at least 70%, $$(Tb_xR_{1-x})_2O_3 \tag{I}$$

wherein x is 0.4≤x≤1.0; R includes at least one element selected from the group consisting of scandium, yttrium, lanthanum, europium, gadolinium, ytterbium, holmium and lutetium.

12 Claims, 2 Drawing Sheets

(56) References Cited

FOREIGN PATENT DOCUMENTS

| | | | |
|---|---|---|---|
| JP | 10297933 | A * | 11/1998 |
| JP | 2000-266947 | A | 9/2000 |
| JP | 2007-334357 | A | 12/2007 |
| WO | WO 2007/004366 | A1 | 1/2007 |

OTHER PUBLICATIONS

Supplementary European Search Report for European Patent Application No. 10786124.7, dated Nov. 9, 2012.
International Search Report dated Aug. 31, 2010 in International Application No. PCT/JP2010/059514.
Japanese Office Action dated Jul. 31, 2012, for Application No. 2009-138473.

* cited by examiner

OXIDE AND MAGNETO-OPTICAL DEVICE

TECHNICAL FIELD

The present invention relates to an oxide and a magneto-optical device. More particularly, the present invention relates to an oxide suitable for constituting a magneto-optical device such as optical isolator, etc., and to a magneto-optical device comprising the oxide.

BACKGROUND ART

Recently, with the development of laser processing machines, magneto-optical devices utilizing the interaction of light and magnetism have become of much interest. One of these devices is an isolator, which operates as follows: When the light oscillated from a laser source is reflected by the optical system in its path and is returned to the light source, then it disturbs the light oscillated from the laser source thereby providing an unstable oscillation state; and the isolator prevents the phenomenon. Accordingly, based on the action, the optical isolator is arranged between a laser source and an optical member and is utilized therebetween.

The optical isolator comprises three parts, a Faraday rotator, a polarizer arranged on the light-incoming side of the Faraday rotator, and an analyzer arranged on the light-outgoing side of the Faraday rotator. The optical isolator functions based on its property that when light comes in the Faraday rotator thereof under the condition where a magnetic field is applied to the Faraday rotator in the direction parallel to the light running direction, then the plane of polarization rotates in the Faraday rotator. That is the Faraday effect. Specifically, the light of the incident light having the same plane of polarization as that of the polarizer is, after having passed through the polarizer, introduced into the Faraday rotator. The light is rotated by +45 degrees relative to the light running direction in the Faraday rotator, and then goes out of the isolator.

As opposed to this, when the light returning into the Faraday rotator in the direction opposite to the incident direction first passes through the analyzer, only the component of the light having the same plane of polarization as that of the analyzer passes through the analyzer and is introduced into the Faraday rotator. Then, in the Faraday rotator, the plane of polarization of the returning light is further rotated by +45 degrees in additional to the initial +45 degrees, and therefore, the plane of polarization thereof is at a right-angle of +90 degrees with respect to the polarizer, and the returning light cannot pass through the polarizer.

It is necessary that the material to be used for the Faraday rotator of the optical isolator mentioned above has a large Faraday effect and has high transmittance at the wavelength at which it is being used.

Recently, as laser processing machines, many devices with fiber laser have become much utilized. The oscillation wavelength of the laser is 0.9 to 1.1 μm, and terbium gallium garnet single crystal (abbreviation: TGG), terbium aluminum garnet single crystal (abbreviation: TAG), etc. are used as the material having a large Faraday effect and high transmittance at the wavelength (See Patent Document 1).

The Faraday rotation angle θ is represented by Formula (A):

$$\theta = V \times H \times L \tag{A}$$

In Formula (A), V is a Verdet constant, which is a constant determined by the material of the Faraday rotator; H is the intensity of the magnetic field; and L is the length of the Faraday rotator. For use as an optical isolator, L is determined so that θ=45 degrees.

Accordingly, the factors which determine the size of the optical isolator include the Verdet constant and the intensity of the magnetic field. The Verdet constant of terbium gallium garnet single crystal is 0.13 min/(Oe·cm), the Verdet constant of terbium aluminum garnet single crystal is 0.14 min/(Oe·cm). In case where a single crystal of the type is used and when the level of the magnetic field is 10,000 Oe, then it is necessary that the length of the Faraday rotator is 20 to 25 mm in order to rotate the plane of polarization of the incident light by +45 degrees. Accordingly, the Faraday rotator having that size must be used and a polarizer and an analyzer formed of, for example, a rutile crystal must be fitted to both sides of the Faraday rotator, or that is, the size of the optical isolator will have to be at least about 70 mm. For downsizing the module of fiber laser, the optical isolator must be downsized, and therefore, a material capable of shortening its constitutive member, the Faraday rotator, must be developed.

On the other hand, as a material having a large Faraday rotation angle per unit length, there is known iron (Fe)-containing yttrium iron garnet (commonly known as YIG) single crystal (see Patent Document 2). However, this material has a large light absorption at a wavelength of 0.9 μm and the absorption has some influence on wavelengths in a range of 0.9 to 1.1 μm. Therefore, this material is unsuitable for use in that range.

(Patent Document 1) JP-A-7-089797 (JP-A denotes a Japanese unexamined patent publication application)
(Patent Document 2) JP-A-2000-266947

DISCLOSURE OF THE INVENTION

Problem to be Solved by the Invention

An object of the present invention is to provide an oxide including terbium oxide, which has a large Verdet constant in a wavelength range around 1.06 μm (0.9 to 1.1 μm) and has high transmittance. Another object of the present invention is to provide a downsized magneto-optical device favorable for use in fiber lasers for processing machines.

Means for Solving the Problem

The above-mentioned problems with the present invention have been solved by the following means <1>, <4>, <7> and <8>. These are described along with preferred embodiments <2>, <3>, <5>, <6> and <9>.

<1> An oxide containing the oxide represented by Formula (I) as the main component thereof, having a Verdet constant at a wavelength of 1.06 μm of at least 0.18 min/(Oe·cm), and having a transmittance at a wavelength of 1.06 μm and for an optical length of 3 mm of at least 70%:

$$(Tb_xR_{1-x})_2O_3 \tag{I}$$

(In Formula (I), x is 0.4≤x≤1.0; R contains at least one element selected from the group consisting of scandium, yttrium, lanthanum, europium, gadolinium, ytterbium, holmium and lutetium.)

<2> The oxide of <1> wherein in Formula (I), R is selected from the group consisting of scandium, yttrium, lanthanum, europium, gadolinium, ytterbium, holmium and lutetium.

<3> The oxide of <1> or <2>, containing a metal oxide selected from the group consisting of alkaline earth metal oxides, Group 13 element oxides, Group 14 element oxides and Group 4 element oxides, in an amount of 0.00001 wt % to 0.1 wt %.

<4> The oxide of any one of <1> to <3> which is a single crystal.

<5> The oxide of <4>, containing an alkaline earth metal oxide in an amount of 0.0001 wt % to 0.1 wt %.

<6> The oxide of <4> or <5> produced by a production method selected from the group consisting of a floating zone melt method, a micro-pull down method, a pull up method, a skull melt method, and a Bridgman method.

<7> The oxide of any one of <1> of <3>, which is a ceramic.

<8> A magneto-optical device comprising the oxide of any one of <1> to <7>.

<9> The magneto-optical device of <8>, which is an optical isolator for a wavelength range of 0.9 μm to 1.1 μm, which comprises the oxide of any one of <1> to <7> as a Faraday rotator, and which comprises a polarizing material arranged before and after the Faraday rotator.

Effects of the Invention

According to the present invention, there is provided an oxide including terbium oxide, which has a large Verdet constant in a wavelength range around 1.06 μm and which has high transparency. Also according to the present invention, there is provided a downsized magneto-optical device favorable for use as fiber lasers for processing machines.

MODES FOR CARRYING OUT THE INVENTION

Figure 1:
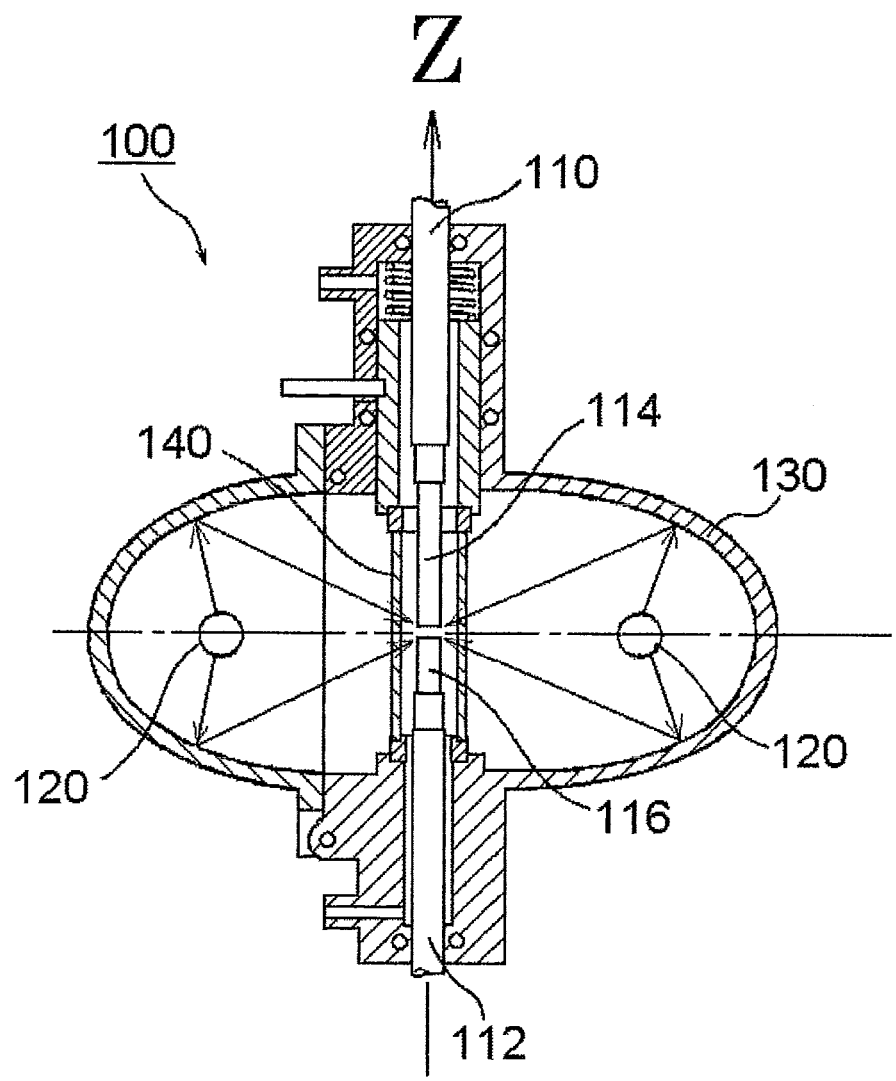
FIG. 1 is a cross-sectional view showing one example of an apparatus suitable for use for a floating zone method.

The oxide of the present invention contains an oxide represented by Formula (I) as the main component thereof, and has a Verdet constant at a wavelength of 1.06 μm of at least 0.18 min/(Oe·cm) and has a transmittance at a wavelength of 1.06 μm and for an optical length of 3 mm of at least 70%:

(In Formula (I), x is 0.4≤x≤1.0; R contains at least one element selected from the group consisting of scandium, yttrium, lanthanum, europium, gadolinium, ytterbium, holmium and lutetium.)

Based on the characteristic of a paramagnetic element, terbium and its oxide, that they have high transmittance at a wavelength of 1.06 μm, the present inventors have assiduously investigated the practicality of enlarging the Verdet constant thereof at that wavelength. As a result, the inventors have found that, when a uniform solid solution containing terbium oxide in a ratio by mol of at least 40% and containing a rare earth element oxide that is transparent at a wavelength of 1.06 μm, such as yttrium, scandium, lanthanum, lutetium, etc. (preferably a single crystal or a ceramic) is formed, then its Verdet constant at a wavelength of 1.06 μm should be at least 0.18 min/(Oe·cm), and they have completed the present invention.

Terbium (Tb) is a paramagnetic element, and its light transmittance at a wavelength of 1.06 μm for an optical length of 3 mm is at least 70%; and therefore this is the most suitable element for use in an isolator for that wavelength range. Accordingly, forming a compound that contains terbium in as high an amount as possible will bring about enlarging the Verdet constant of that compound at 1.06 μm and enlarging the Faraday rotation angle thereof. For forming a compound having high transparency at a wavelength of 1.06 μm, preferably, the other elements constituting the compound have high transparency in that wavelength range; and the compound most suitable for it is an oxide of an element having a light transmittance of at least 70% at a wavelength of 1.06 μm and for an optical length of 3 mm.

On the other hand, an oxide containing terbium in the largest amount and having a highest Verdet constant is terbium oxide of itself. The inventors tried growing the single crystal according to a flowing zone method; however, after the growth, the crystal cracked in cooling. Though the detailed reason is not clear as yet, it is considered that terbium oxide may include two morphologies of $Tb_2O_3$ where Tb is trivalent and $TbO_2$ where Tb is tetravalent, and during cooling, the oxide undergoes phase transition and cracks.

Accordingly, the inventors have investigated a solid solution of terbium oxide with any other oxide which has the same crystal structure as that of terbium oxide, which comprises the same rare earth element group, which is stable when its oxidation valence is trivalent and which has high transparency at a wavelength of 1.06 μm. The choices include scandium, yttrium, lanthanum, europium, gadolinium, ytterbium, holmium and lutetium; and the inventors recognized that a solid solution of an oxide of that metal and terbium oxide is suitable.

Further, in the solid solution, the concentration of terbium oxide can be changed freely in some degree. Accordingly, on varying the concentration of terbium oxide therein, crystals were produced according to a floating zone method, and the Verdet constant of the crystals was measured. As a result, it has been found that, when the ratio by mol of terbium oxide is at least 40%, then the Verdet constant of the solid solution at a wavelength of 1.06 μm should be at least 0.18 min/(Oe·cm).

In addition, the inventors have further found that when the solid solution is analyzed through X-ray powder diffractiometry for the crystal structure thereof, then terbium oxide and other rare earth oxides mentioned above are the same cubic crystals, and therefore the solid solution is also the same cubic crystal.

In this embodiment, "solid solution" means that terbium existing at the lattice point of the crystal layer of terbium oxide of the starting powder is quite irregularly substituted with any other element (for example, yttrium, etc.). Accordingly, this includes, single crystals, polycrystals, and polycrystalline ceramics produced through sintering, etc.

The present invention is described in more detail hereinbelow.

In the present invention, the wording "A to B" indicating the numerical range means "at least A but no greater than B" unless otherwise specifically indicated. In other words, the wording means the numerical data including the end points A and B.

(Oxide Represented by Formula (I))

The oxide of the present invention contains an oxide represented by Formula (I) as the main component thereof.

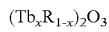

(In Formula (I), x is 0.4≤x≤1.0; R contains at least one element selected from the group consisting of scandium (Sc), yttrium (Y), lanthanum (La), europium (Eu), gadolinium (Gd), ytterbium (Yb), holmium (Ho) and lutetium (Lu).)

In Formula (I), R is not specifically defined so far as it contains at least one element selected from the group consisting of scandium, yttrium, lanthanum, europium, gadolinium, ytterbium, holmium and lutetium, and may contain any other element. Examples of the other element are erbium and thulium.

The content of the other element is preferably no greater than 50 relative to 100 of the total amount of R, more preferably no greater than 10. Yet more preferably, the content of the other element is 0, that is, R is an element alone selected from the group consisting of scandium, yttrium, lanthanum, europium, gadolinium, ytterbium, holmium and lutetium, not containing any other element.

R may be a single element, or the formula may contain different R's in any desired ratio with any specific limitation thereon.

Among them, yttrium, gadolinium and lutetium are preferred for R from the viewpoint that the starting materials are easily available; and yttrium is more preferred.

In Formula (I), x is 0.4 to 1.0. Specifically, the oxide represented by Formula (I) contains at least 40 mol % of $Tb_2O_3$ as a ratio by mol.

In Formula (I), when x is less than 0.4, the oxide would not have a high Verdet constant.

Preferably, x is at least 0.4 but less than 1.0, more preferably 0.4 to 0.8, yet more preferably 0.45 to 0.75. When x falls within the above range, it is preferable since the oxide has a high Verdet constant and since the oxide is excellent in transparency. In particular, when x is no greater than 0.8, it is preferable since the crystal is, after being grown, prevented from cracking during cooling, and thus the crystal is prevented from being cloudy.

(Oxide of the Present Invention)

The oxide of the present invention contains an oxide represented by Formula (I) as the main component thereof.

Specifically, the oxide of the present invention may contain an oxide represented by Formula (I) as the main component thereof, and may contain any other component as the accessory constituent. In other words, the oxide of the present invention contains an oxide represented by Formula (I) as the main component and may contain any other component (any other oxide, etc.).

The wording "contain an oxide as the main component" means that the oxide of the present invention contains an oxide represented by Formula (I) in an amount of at least 50 wt % of the oxide of the present invention. Preferably, the content of the oxide represented by Formula (I) is at least 80 wt %, more preferably at least 90 wt %, yet more preferably at least 99 wt %, particularly preferably at least 99.9 wt %, most preferably at least 99.99 wt %.

The other component that the oxide of the present invention may contain is preferably a metal oxide selected from the group consisting of alkaline earth metal oxides, Group 13 element oxides, Group 14 element oxides, and Group 4 element oxides.

The content of the oxide is preferably 0.000001 wt % to 1.0 wt % of the oxide of the present invention, more preferably 0.00001 to 0.1 wt %, yet more preferably from 0.0001 to 0.01 wt %.

Concretely, the alkaline earth metal oxide includes magnesium oxide, strontium oxide and barium oxide; the Group 13 element oxide includes aluminum oxide (alumina), gallium oxide; the Group 14 element oxide includes silicon oxide, germanium oxide, tin oxide; and the Group 4 element oxide include titanium oxide, zirconium oxide, hafnium oxide.

The metal oxide may be added, for example, as a dopant to be added in single crystal formation, or as a residue of the sintering promoter added in ceramic production.

As the dopant to be added in single crystal formation, preferred is an alkaline earth metal oxide, such as magnesium oxide, strontium oxide, barium oxide, etc. The oxide is added preferably in an amount of 0.000001 to 1.0 wt % of the entire oxide of the present invention, more preferably 0.00001 to 0.1 wt %, yet more preferably 0.0001 to 0.01 wt %.

The sintering promoter includes, for example, alkaline earth metal carbonates such as magnesium carbonate, as well as alumina, gallium oxide, titanium oxide, silicon oxide, germanium oxide, zirconium oxide, hafnium oxide, etc. In case where, for example, an alkaline earth metal carbonate is used as the sintering promoter, the obtained oxide is oxidized by sintering and therefore contains an alkaline earth metal oxide derived from the promoter.

The content of the alkaline earth metal oxide is preferably 0.00001 to 1.0 wt % of the entire oxide of the present invention, more preferably 0.0001 to 0.1 wt %, yet more preferably 0.0001 to 0.01 wt %.

In production of the oxide, the oxide single crystal and the ceramic of the present invention, some accessory constituents may mix therein; and for example, constituent components of a crucible may mix therein. The oxide of the present invention does not exclude the contamination thereof with such unexpected accessory constituents; however, its amount is no greater than 50 wt %, preferably no greater than 20 wt %, more preferably no greater than 10 wt %, yet more preferably no greater than 1 wt %, particularly preferably no greater than 0.1 wt %, most preferably no greater than 0.01 wt %, as a total with the other components mentioned above.

The oxide of the present invention has a Verdet constant at a wavelength of 1.06 μm of at least 0.18 min/(Oe·cm). Not specifically defined, the Verdet constant is preferably at least 0.18 min/(Oe·cm); however, the oxide has a higher Verdet constant. When the Verdet constant is less than 0.18 min/(Oe·cm), then the Faraday rotator necessary to attain the Faraday rotation angle of 45° shall be long, and the optical isolator will accordingly be large-scaled.

Preferably, the Verdet constant is at least 0.20 min/(Oe·cm), more preferably at least 0.21 min/(Oe·cm), yet more preferably at least 0.22 min/(Oe·cm). From the viewpoint of easiness of production, it is preferably no greater than 0.36 min/(Oe·cm).

In the present invention, the Verdet constant may be determined according to conventional methods with no specific limitation thereon.

Concretely, the oxide having a given thickness is cut out, polished to have a mirror face, and set with a permanent magnet having a known magnetic field, and its Verdet coefficient at a wavelength of 1.06 μm is measured. The measurement is carried out at 25±10° C. in air.

The oxide of the present invention is characterized by having a transmittance (light transmittance) of at least 70% at a wavelength of 1.06 μm for an optical length of 3 mm. When the transmittance is less than 70%, the transparency is low and the oxide is unfavorable for use as a Faraday rotator.

The oxide of the present invention has a transmittance of at least 70% at a wavelength of 1.06 μm and for an optical length of 3 mm, preferably at least 72%, more preferably at least 75%. The transmittance is preferably higher, and not specifically limited, its uppermost limit is preferably at most 100%.

The transmittance is determined by the intensity of light having a wavelength of 1.06 μm, as passed through the oxide having a thickness of 3 mm. Concretely, the transmittance is represented by the following formula:

$$\text{Transmittance} = I/I_0 \times 100,$$

(in the formula, I indicates the intensity of the transmitted light (the intensity of the light having passed through the sample having a thickness of 3 mm); and $I_0$ indicates the intensity of the incident light.

In case where the transmittance of the obtained oxide is not uniform, and fluctuates in different sites analyzed, then the data of 10 arbitrary points are averaged, and the resulting mean transmittance is the transmittance of the oxide.

The oxide of the present invention has a transmittance of at least 70% at a wavelength of 1.06 μm and for an optical length of 3 mm, but preferably has a high transmittance even for a long optical length. Concretely, the transmittance for an optical length of 10 mm is preferably at least 60%, more preferably at least 70%, yet more preferably at least 72%, particularly preferably at least 75%. The same shall apply to the transmittance for an optical length of 15 mm, which is preferably at least 60%, more preferably at least 70%, yet more preferably at least 72%, particularly preferably at least 75%.

In case where the oxide of the present invention is used especially as a Faraday rotator, its transmittance for an optical length of 10 mm is preferably at least 70%.

(Oxide Single Crystal, Ceramic)

The oxide of the present invention may be a single crystal or a ceramic and is not specifically limited, so far as it satisfies the above-mentioned requirement. The case where the oxide of the present invention is an oxide single crystal, and the case where the oxide of the present invention is a ceramic are described in detail hereinbelow along with their production methods.

<Oxide Single Crystal>

The oxide of the present invention may be an oxide single crystal. Specifically, the oxide single crystal is an oxide single crystal comprising the oxide of the present invention.

The method for forming an oxide crystal is not specifically limited, and includes, for example, a floating zone melt method, a micro-pull down method, a pull up method, a skull melt method, and a Bridgman method. These methods are described in detail in "Newest Technology and Application Development of Bulk Single Crystal" (edited by Shosei Fukuda, published by CMC, March 2006) and "Handbook of Crystal Growth" (edited by the Editorial Committee for "Handbook of Crystal Growth" of the Japanese Association for Crystal Growth, published by Kyoritsu Publishing, September 1995).

In formation of the oxide single crystal, preferably, an alkaline earth metal oxide (for example, magnesium, calcium, strontium, barium) is doped for stable crystallization in an amount of 0.001 to 0.01 wt %, as described above.

Typical production methods are described in detail hereinbelow.

<Floating Zone Method>

One embodiment of forming an oxide single crystal according to a floating zone method is described.

For the floating zone method for producing a single crystal, for example, reference is made to JP-A-62-271385.

First, as starting materials, powdery materials ($Tb_2O_3$ and $R_2O_3$ and other components) having a high purity (preferably at least 99.9 wt %) are prepared and mixed to give a mixed powder. R contains at least one element selected from the group consisting of scandium, yttrium, lanthanum, europium, gadolinium, ytterbium, holmium and lutetium, and is preferably selected from the group consisting of scandium, yttrium, lanthanum, europium, gadolinium, ytterbium, holmium and lutetium.

The mixed powder for use for production and the preparation of the shaped compact thereof are described below.

A xenon lamp floating zone method (xenon lamp FZ method), a type of an optical floating zone method is described in detail with reference to FIG. 1.

Unless otherwise specifically indicated, the same reference numeral means the same object.

FIG. 1 is a conceptual cross-sectional view showing the constitution of a xenon lamp FZ apparatus 100 for use in a xenon lamp FZ method. The xenon lamp FZ apparatus 100 is so designed as to comprise a xenon lamp 120 light source for melting, and an oval mirror 130, in which the oval mirror 130 is formed by connecting two ovals to be endless, and this acts to focus the light from the xenon lamp 120 toward the sample to heat and melt it. In FIG. 1, the xenon lamp FZ apparatus 100 is so designed that a hollow quartz tube 140 for putting a sample therein and two xenon lamps are inside one oval mirror 130. Two ovals forming the oval mirror 130 each have two focal points, and the oval mirror 130 therefore has four focal points in total. Of the four focal points of the oval mirror 130, two focal points overlap with each other, and the quartz tube 140 is so arranged that it runs through the overlapping points. The axial cores of the two xenon lamps 120 are so arranged that they run through the remaining two focal points of the four focal points of the oval mirror 130.

The inner surface of the oval mirror 130 is mirror-finished. The xenon light emitted by the xenon lamp 120 is reflected on the mirror-finished oval mirror 130, and is led to come in the quartz tube 140 at the axial core part nearly in every direction. As the light source, usable is a halogen lamp in addition to the xenon lamp; however, the xenon lamp is advantageous in that its ultimate temperature can be high and its light-focusing degree can be sharp, and therefore the temperature gradient can be steep.

The quartz tube 140 has a rotatable upper shaft 110 and a lower shaft 112 as downwardly separated from the lower end of the upper shaft 110, inside the tube. The upper shaft 110 and the lower shaft 112 are movable up and down inside the quartz tube 140. Inside the quartz tube 140, the atmosphere for crystal growth is controllable. As a starting material rod, a shaped compact of the starting material is fitted to the upper shaft 110. Preferably, a material of seed crystal is fitted to the lower shaft, but a shaped compact of the starting material or a sintered compact of the starting material may be fitted thereto. In this state, a shaped compact of the starting material fitted to the upper shaft is referred to as a feed rod 114; and the shaped compact or the sintered compact of the starting material or the material as a seed crystal fitted to the lower shaft is referred to as a seed rod 116.

In FIG. 1, preferably, the quartz tube 140 is kept under positive pressure by introducing argon gas and a few % of hydrogen gas from one end to the other end (not shown) thereinto. One reason for this is for protecting the quartz tube 140 from being invaded by air from the outside; and another reason is for protecting terbium oxide contained in the starting material rod (feed rod 114) from being oxidized during crystal growth.

Subsequently, the feed rod 114 and the seed rod 116 are fitted to the upper and lower shafts 110 and 112, respectively, these are so arranged that their ends are kept adjacent to each other, and in that condition, the output of the xenon lamp 120 is elevated up to a temperature at which both the lower end of the feed rod 114 and the upper end of the seed rod 112 begin to melt. And then, the rods are moved closer to each other while rotated reversely. These two rods need no rotation. In this condition, the two rods are kept in contact with each other to form a melt part. In this situation, while the output of the xenon lamp 120 is delicately controlled, the seed rod 116 and the feed rod 114 are gradually let down so that the formed melt part will maintain a suitable melt form by its surface tension. Accordingly, a crystal having a predetermined composition is formed at the lower part of the melt part, or that is, at the upper part of the seed rod 116. When the descending speed of the seed rod 116 and that of the feed rod 114 are made the same, then the crystal is grown. When the crystal is grown to a predetermined length or when the seed rod 116 is consumed, the descending of the rod is stopped and the output of the xenon lamp 120 is gradually lowered to lower the temperature, whereby a transparent crystal can be obtained.

In the floating zone method, the obtained crystal is grown under a strong temperature gradient condition, and therefore thermal strain during the growth remains in the crystal; and during cutting, the crystal may be cracked. Accordingly, after the crystal growth, it is desirable that, using a carbon furnace, the crystal is put into a carbon container and annealed therein in an inert atmosphere or a reducing atmosphere at 1,200° C. or higher to remove the thermal strain. The annealing temperature is not specifically limited, but is preferably 1,200 to 2,200° C., more preferably 1,400 to 2,200° C., yet more preferably 1,600 to 2,000° C. Also not specifically limited, the annealing time is preferably 1 to 100 hours, more preferably 5 to 50 hours, yet more preferably 10 to 50 hours.

In case where the obtained single crystal is used as the Faraday rotator of an isolator, preferably, after cutting, its surface is mirror-finished with an abrasive, etc. Not specifically limited, the abrasive may be, for example, colloidal silica.

<Micro-Pull Down Method>

As another method for forming an oxide single crystal, a micro-pull down method for forming a single crystal is described below. Regarding the micro-pull down method, reference is made to JP-A-2001-226196.

First, the starting material powders are weighed in a desired ratio by mol. Before fed into the apparatus, the powdery starting materials are thoroughly mixed, or may be good to be dried or sintered, for which any known method is suitably employed. The method of preparing the mixed powder is described below.

Using a micro-pull down apparatus, a single crystal is grown.

Figure 2:
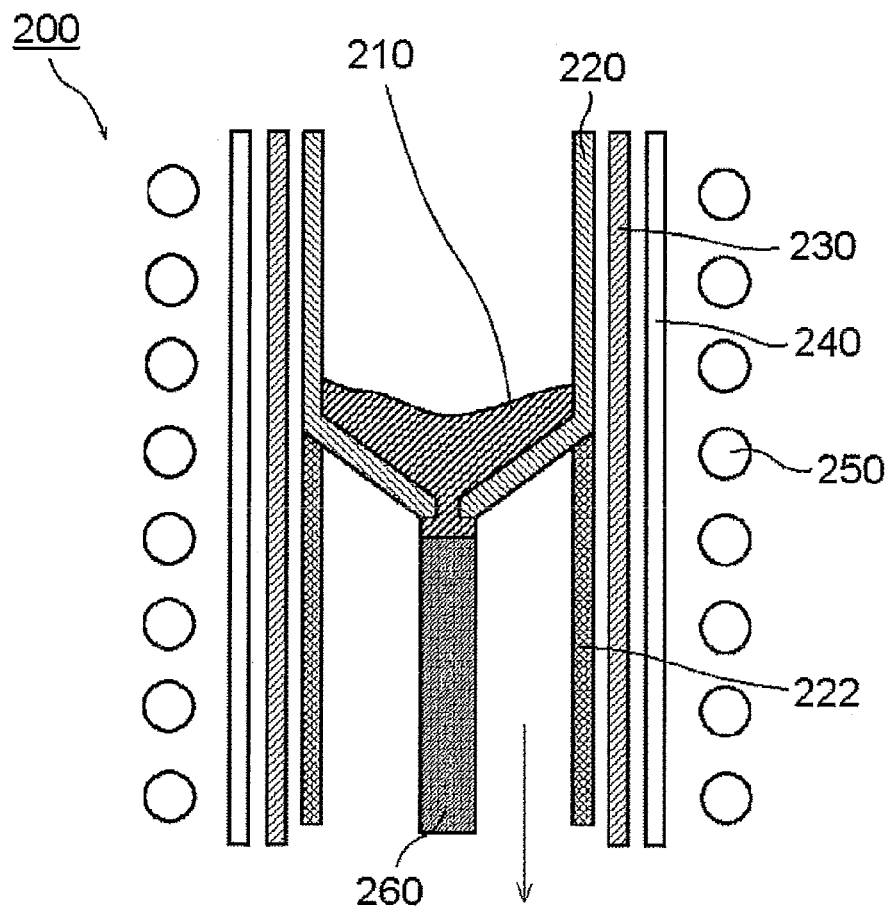
FIG. 2 is an explanatory view showing one example of a micro-pull down method.

FIG. 2 is an explanatory view showing one example of the micro-pull down method favorably used as an embodiment.

The micro-pull down apparatus 200 for use in the micro-pull down method is a single crystal growing apparatus that comprises a crucible 220, a seed holding tool 260 for holding the seed to be kept in contact with the melt 210 flowing out from the pore formed through the bottom of the crucible, a moving mechanism (not shown) for moving downward the seed holding tool 260, a moving speed controller (not shown) for the moving mechanism, and an induction heater 250 for heating the crucible 220. In FIG. 2, the lower part of the crucible 220 is supported by the crucible supporting tool 222, and an insulating jacket 230 and a quartz tube 240 are provided outside the crucible 220, and the crucible 220 is thus heated by the induction heater 250 from the outside of the quartz tube 240.

The crucible 220 is preferably formed of a rhenium metal sintered compact or a rhenium metal alloy sintered compact from the viewpoint of the heat resistance thereof, and preferably, an after heater (not shown) that is a heater formed of a rhenium metal sintered compact or a rhenium metal alloy sintered compact is arranged around the outer periphery of the bottom of the crucible. The heat value of the crucible 220 and the after heater can be controlled by controlling the output of the induction heater 250, whereby the heating temperature and the temperature profile of the solid-liquid interface of the melt 210 to be drawn out through the pore formed through the bottom of the crucible can be controlled.

In this apparatus, preferably, multiple fine pores are provided each having a size through which the melt does not drop down (preferably having a diameter of 200 μm to 300 μm), and the falling melts through the fine pores will join together before they are brought into contact with the seed crystal or the sintered compact formed by shaping a sintered starting material having the same composition.

Using this apparatus, the sintering material prepared according to the above-mentioned method is set in the crucible 220. Before heating, preferably, the furnace is made to have an inert gas atmosphere inside it, and by gradually applying a high-frequency power to the high-frequency induction heating coil (induction heater 250), the crucible 220 is thereby heated and the material inside the crucible 220 is completely melted. If possible, this state is preferably maintained for a few hours in order that the melt 210 will have a uniform composition.

The seed crystal or the sintered shaped rod is gradually elevated at a predetermined speed, and its top is kept in contact with the fine pore of the bottom of the crucible and is thereby well wetted with the melt. Subsequently, with the temperature of the melt kept controlled, the pull down axis is let down to thereby make the crystal grow. At the point when the prepared materials have been all crystallized and the melt has disappeared, the crystal growth is finished. The grown crystal is, while kept on an after heater, preferably gradually cooled down to room temperature.

(Ceramic (Transparent Ceramic))

The solid solution does not have to be a single crystal so far as it is highly transparent at a wavelength of 1.06 μm and is free from anisotropy such as thermal strain, etc., and may be a polycrystalline ceramic (in the present invention, this may be referred to as a transparent ceramic). In the present invention, the transparent ceramic means a ceramic having a transmittance of at least 70% at a wavelength of 1.06 μm and for an optical length of 3 mm.

In case where a single crystal is produced, the system must be heated up to a high temperature so as to form a melt state. Terbium oxide has a melting point of about 2,600° C., yttrium oxide has a melting point of about 2,300° C.; and when the two oxides form a solid solution, they must be heated up to the intermediate temperature of the two melting points, or that is, they must be heated up to an extremely high temperature. Accordingly, in case where a single crystal is formed by melting in a crucible, the material of the crucible to be selected is extremely limited to rhenium, tungsten or their alloy, etc.

On the other hand, a transparent ceramic does not need heating up to its melting point, but can be made transparent at a temperature not higher than the melting point thereof so far as it is sintered under pressure. During sintering, a sintering promoter may be added to increase the sintering density to thereby make the sintered ceramic densified.

The method for forming the transparent ceramic is not specifically limited, and any conventionally known method may be suitably selected and employed. The production method for transparent ceramics includes a hot isostatic pressing method, a combination of a solid phase method and a press forming method, a method of vacuum sintering by die casting, etc., which are described in Akio Ikesue, "From Optical Single Crystal to Optical Polycrystal", Applied Physics, Vol. 75, No. 5, pp. 579-583 (2006); Takahiro Yanagiya & Hideki Yagi, "Current State and Future Prospects of Ceramic Laser Materials" Laser Studies, Vol. 36, No. 9, pp. 544-548 (2008), etc.

As a production method for a transparent ceramic, one example of a hot isostatic pressing (HIP) method for producing a transparent ceramic is described hereinbelow.

First, a mixed powder of starting material powders ($Tb_2O_3$ and $R_2O_3$ and other components) are prepared and mixed to give a mixed powder. The method for preparing the mixed powder is described below. A solvent, a binder, a plasticizer, a lubricant and others are added to the obtained mixed powder, and wet-mixed to be slurry. In this state, the above-mentioned sintering promoter may be added in a predetermined amount, preferably in an amount of 0.00001 to 1.0 wt % of the total amount of all the starting materials, more preferably 0.0001 to 0.1 wt %, yet more preferably 0.001 to 0.01 wt %. The obtained slurry is processed with a spray drier and dried, and thereafter this is shaped. The shaping may be attained in one stage or in multiple stages. After shaped, preferably this may be degreased by heating (preferably at 400 to 600° C.).

Subsequently, this is preferably sintered in a vacuum furnace. Regarding the sintering condition, the temperature is preferably 1,600 to 2,000° C., more preferably 1,700 to 1,900° C., yet more preferably 1,750 to 1,850° C. The sintering time is preferably 1 to 50 hours, more preferably 2 to 25 hours, yet more preferably 5 to 20 hours. In this stage, the heating speed is preferably 100 to 500° C./hr up to around 1,200° C. or so, more preferably 200 to 400° C./hr, yet more preferably 250 to 350° C./hr; and at a temperature higher than it, the heating speed is preferably lowered to be 25 to 75° C./hr. The vacuum degree in sintering is preferably at most 1 Pa, more preferably at most $1\times10^{-1}$ Pa.

After thus sintered, this is processed according to a hot isotropic pressing (HIP) method for further increasing the transparency thereof. The processing temperature is preferably higher than the sintering temperature, and is preferably 1,600 to 2,000° C., more preferably yet 1,700 to 1,900° C., yet more preferably 1,750 to 1,850° C. The processing pressure is preferably 10 to 1,000 MPa, more preferably 20 to 500 MPa, yet more preferably 40 to 200 MPa. The processing time is not specifically limited, but is preferably no greater than 50 hours, more preferably no greater than 25 hours, yet more preferably no greater than 10 hours. Also preferably, the time is at least 15 minutes, more preferably at least 30 minutes, yet more preferably at least 1 hour.

<Preparation of Mixed Powder and Shaped Compact>

In the present invention, the starting materials for the mixed powder and its shaped compact to be used in production of the oxide single crystal and the transparent ceramic are weighed in a desired molar ratio.

The powdery materials ($Tb_2O_3$, $R_2O_3$, and other components) for use herein are preferably of high-purity, having a purity of at least 99.9 wt %, more preferably at least 99.99 wt %, yet more preferably at least 99.999 wt %. R in $R_2O_3$ has the same meaning as that of R in Formula (I), and its preferred range is also the same.

Terbium oxide is not limited to $Tb_2O_3$, and $Tb_4O_7$ may also be used. However, use of $Tb_2O_3$ is preferred since the crystallinity of the obtained oxide is excellent.

The powdery materials are weighed in a desired molar ratio, then dry-mixed or wet-mixed with no specific limitation thereon. After thus wet or dry-mixed, the mixture may be sintered; or the mixture may be sintered and further ground.

Concretely, after the materials are dry-mixed with a ball mill, etc., the mixed powder is sintered in an inert gas atmosphere. This method may be referred to herein as one example. The sintering temperature and the sintering time are not specifically limited. The sintering temperature is preferably 600 to 2,000° C., more preferably 800 to 1,800° C., yet more preferably 1,000 to 1,800° C. The inert gas atmosphere includes a rare gas atmosphere, a nitrogen gas atmosphere, etc.; preferably, however, the mixed powder is sintered in an argon atmosphere. The sintering time is not specifically limited, but may be suitably selected depending on the water content of the mixed powder and the sintering temperature. The sintering time is preferably 1 to 100 hours, more preferably 5 to 50 hours, yet more preferably 10 to 30 hours. After sintered, the material is preferably ground and mixed in a ball mill, etc.

For the purpose of sharpening the mean particle size distribution of the mixed powder and for the purpose of making the mixed powder have a high purity, the powdery materials may be melted, recrystallized and ground, and then used as starting material powders.

Concretely, starting material powders having a high purity (for example, at least 99.9%) are prepared, and are weighed so that $Tb_2O_3/R_2O_3$ therein is in a desired molar ratio. These starting material powders are dissolved to prepare an aqueous nitric acid solution having a concentration of 1 mol/l, and an aqueous ammonium sulfate solution having a concentration of 1 mol/l is mixed therein, and further ultrapure water was added, the concentration was controlled, and with the resulting aqueous solution kept stirred, an aqueous ammonium hydrogencarbonate solution having a concentration of 0.5 mol/l was dropwise added at a constant addition rate until the system has a pH of 8, and with stirring, this was left at room temperature for a few days, and thereafter filtered and washed with ultrapure water, and dried at 150° C. for a few days. This method is employable here as one example. The obtained mixed powder is put into an alumina crucible, and calcined in an inert atmosphere such as a nitrogen atmosphere, an argon atmosphere, etc., preferably at 800 to 1,500° C., more preferably at 1,000 to 1,400° C., yet more preferably at 1,100 to 1,200° C., and preferably for 0.5 to 10 hours, more preferably for 1 to 7 hours, yet more preferably for 2 to 4 hours. In this state, the inert atmosphere is employed for preventing the valence of terbium oxide from changing.

After the powdery materials are thoroughly mixed, the mixture may be shaped to have a desired shape and size, using a shaping machine. The shape to be formed is not specifically limited, and may be suitably selected depending on the apparatus to be used. For example, the mixture may be shaped to be columnar.

One example of the shaping method for the powdery materials comprises, for example, thoroughly dry-mixing the starting material powders and shaping the resulting mixture under pressure using a shaping machine.

An organic binder may be added to make the powdery material into a slurry state; or after this state is shaped and sintered to give a sintered compact, and this may be used as a shaped compact of the starting material. The sintering temperature is preferably 600 to 2,000° C., more preferably 800 to 1,800° C., yet more preferably 1,000 to 1,800° C. The sintering atmosphere is preferably a rare gas or inert gas atmosphere, more preferably an argon atmosphere. The sintering time is not specifically limited, but is preferably for 1 to 100 hours, more preferably for 5 to 50 hours, yet more preferably for 10 to 30 hours.

In case where a transparent ceramic is produced according to a HIP method, a shaped compact is first produced and this is processed according to a HIP method.

A concrete production method for a shaped compact comprises adding a solvent, a binder, a plasticizer, a lubricant and others to a starting material powder, and wet-mixing them to be slurry. In this state, a predetermined amount of a sintering promoter may be added. The production method for the shaped compact is not specifically limited. For example, the obtained slurry may be processed with a spray drier to give dry spheres.

The solvent to be used for the slurry is not specifically limited. From the viewpoint of the easiness in handling, preferred is water or a lower alcohol; more preferred is water, methanol or ethanol; and yet more preferred is methanol. Not specifically limited, the binder may be any one suitably selected from known binders, and its one example is polyvinyl alcohol.

The plasticizer and the lubricant are not also specifically limited, and may be suitably selected from known plasticizers and lubricants. One example of the plasticizer is polyethylene glycol; and one example of the lubricant is stearic acid.

The dried spheres are, after shaped, preferably degreased. The shaping method is not specifically limited, and may be suitably selected from any known shaping methods. The shaping may be attained in one stage or in multiple stages.

The degreasing is preferably carried out by heating. The heating temperature is preferably from 400 to 600° C. In degreasing, the heating up to 400° C. may be attained in air, but at a temperature higher than this temperature the heating is carried out preferably in an inert atmosphere.

(Magneto-Optical Device)

The oxide, the oxide single crystal and the ceramic of the present invention are suitable for use in magneto-optical devices. In particular, the oxide, the oxide single crystal and the ceramic of the present invention are suitably used as a Faraday rotator for an optical isolator at a wavelength range of 0.9 to 1.1 μm.

Figure 3:
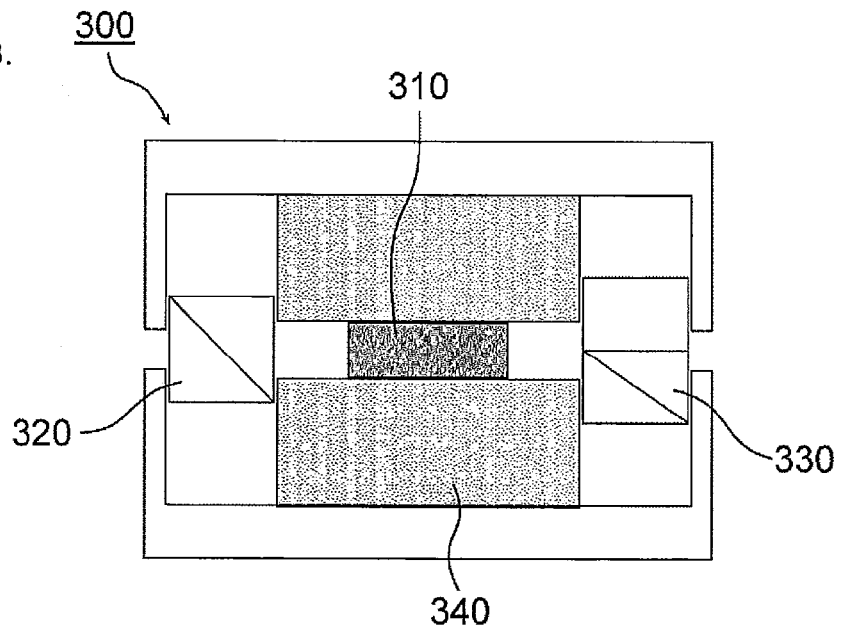
FIG. 3 is a schematic cross-sectional view showing one example of an optical isolator, an optical device having a Faraday rotator as the optical element thereof.

FIG. 3 is a schematic cross-sectional view showing one example of an optical isolator that is an optical device having a Faraday rotator as an optical element.

In FIG. 3, the optical isolator 300 comprises a Faraday rotator 310, and comprises a polarizer 320 of a polarizing material and an analyzer 330 arranged before and after the Faraday rotator 310. In the optical isolator 300, polarizer 320-Faraday rotator 310-analyzer 330 are arranged in that order, and preferably, a magnet 340 is fitted to at least one side face of those components.

The isolator is preferably used for a fiber laser for a processing machine. Specifically, it is suitably used to prevent the oscillation from being unstable by returning the laser light emitted by the laser element to the element.

EXAMPLES

The present invention is further described with reference to Examples and Comparative Examples; however, the present invention is not to be limited to the following Examples.

Examples 1 to 6

Comparative Examples 1 to 3

Powdery starting materials of $Tb_2O_3$ having a high purity of at least 99.9 wt % and $Y_2O_3$ having a purity of at least 99.9 wt % were prepared, and these were weighed in a desired molar ratio of $Tb_2O_3/Y_2O_3$. Subsequently, the starting material composition was thoroughly mixed, and using a shaping machine, the mixture was shaped into a columnar compact having a diameter of 3 mm and a length of 50 mm.

Subsequently, using a xenon lamp FZ apparatus as shown in FIG. 1, a single crystal was grown.

The quartz tube 140 was once processed for drying and deoxygenation, and then, made to have a positive pressure by introducing argon gas and 8% of hydrogen gas from one end to the other end (not shown) thereinto. One reason for this is for protecting the quartz tube from being invaded by air from the outside; and another reason is for protecting terbium oxide contained in the starting material rod from being oxidized during crystal growth.

The above-mentioned, shaped compacts of the starting material both having the same composition and having a size of 3 mm diameter×50 mm length were fitted to the upper and lower shafts, these were so arranged that their ends are kept adjacent to each other, and in that condition, the output of the xenon lamp was elevated up to a temperature at which both the lower end of the feed rod and the upper end of the seed rod began to melt. With that, the rods were moved closer to each other while rotated reversely. In this condition, the two rods were kept in contact with each other to form a melt part. In this moment, while the output of the xenon lamp was delicately controlled, the seed rod and the feed rod were gradually let down at a speed of 8 mm/hr so that the formed melt part maintains a suitable melt form by its surface tension. Accordingly, a crystal having a predetermined composition was formed at the lower part of the melt part, that is, at the upper part of the seed rod. The descending speed of the seed rod and that of the feed rod were made to be the same, and the crystal having a diameter of 3 mm was thus grown. When the crystal was grown to a length of 30 mm, the descending rods were stopped and the output of the xenon lamp was gradually lowered, (taking about 1 hour or so), to thereby lower the temperature to give a transparent crystal.

After thus grown, the crystal was put into a vacuum heat treatment furnace, and annealed in an argon atmosphere at 1,600° C. therein for 15 hours to remove the thermal strain.

The annealed solid solution single crystal having a size of 3 mm diameter×30 mm length was trimmed at their both edges using an internal periphery blade cutter, and both edges were polished with an abrasive such as colloidal silica, etc. thereby mirror-finish them. The Verdet constant of the cylindrical crystal thus obtained having a size of 3 mm diameter× 25 mm length was determined. The results of Examples and Comparative Examples are shown in Table 1.

When the molar ratio of $Tb_2O_3/Y_2O_3$ is at least 0.4/0.6, the Verdet constant was at least 0.18 min/(Oe·cm). This is nearly at least two times the Verdet constant, 0.13 min/(Oe·cm) of a TGG crystal.

In Example 6, an alkaline earth metal oxide, MgO was added for the purpose of more stabilizing the crystallization. MgO was added as follows: $Tb_2O_3$ and $Y_2O_3$ were weighed in a desired molar ratio of $Tb_2O_3/Y_2O_3$, then a predetermined amount of MgO was added thereto, and the starting material mixture was thoroughly mixed. Using a shaping machine, the mixture was shaped into a columnar compact having a size of 3 mm diameter×50 mm length.

TABLE 1

| | $Tb_2O_3$ mol % | $Y_2O_3$ mol % | MgO wt % | Transmittance % | Verdet Constant min/(Oe · cm) |
|---|---|---|---|---|---|
| Example 1 | 0.4 | 0.6 | 0 | 90 | 0.18 |
| Example 2 | 0.5 | 0.5 | 0 | 88 | 0.24 |

TABLE 1-continued

|  | $Tb_2O_3$ mol % | $Y_2O_3$ mol % | MgO wt % | Transmittance % | Verdet Constant min/(Oe · cm) |
|---|---|---|---|---|---|
| Example 3 | 0.6 | 0.4 | 0 | 85 | 0.26 |
| Example 4 | 0.7 | 0.3 | 0 | 72 | 0.30 |
| Example 5 | 0.8 | 0.2 | 0 | 80 | 0.32 |
| Example 6 | 0.8 | 0.2 | 0.001 | 85 | 0.33 |
| Comparative Example 1 | 0.1 | 0.9 | 0 | 90 | 0.06 |
| Comparative Example 2 | 0.2 | 0.8 | 0 | 90 | 0.09 |
| Comparative Example 3 | 0.3 | 0.7 | 0 | 88 | 0.13 |

Examples 7 to 12

Comparative Examples 4 to 9

Subsequently, of rare earth oxides such as scandium, lanthanum, europium, gadolinium, ytterbium, holmium, lutetium, etc., the results of the solid solution single crystals of gadolinium oxide or lutetium oxide and terbium oxide are shown. The production method for the oxide single crystals was the same as in Example 1, except that $Gd_2O_3$ or $Lu_2O_3$ was used in place of $Y_2O_3$.

TABLE 2

|  | $Tb_2O_3$ mol % | $Gd_2O_3$ mol % | Transmittance % | Verdet Constant min/(Oe · cm) |
|---|---|---|---|---|
| Example 7 | 0.4 | 0.6 | 82 | 0.18 |
| Example 8 | 0.5 | 0.5 | 77 | 0.23 |
| Example 9 | 0.6 | 0.4 | 75 | 0.25 |
| Comparative Example 4 | 0.1 | 0.9 | 88 | 0.05 |
| Comparative Example 5 | 0.2 | 0.8 | 87 | 0.08 |
| Comparative Example 6 | 0.3 | 0.7 | 86 | 0.12 |

TABLE 3

|  | $Tb_2O_3$ mol % | $Lu_2O_3$ mol % | Transmittance % | Verdet Constant min/(Oe · cm) |
|---|---|---|---|---|
| Example 10 | 0.4 | 0.6 | 87 | 0.18 |
| Example 11 | 0.5 | 0.5 | 84 | 0.22 |
| Example 12 | 0.6 | 0.4 | 73 | 0.25 |
| Comparative Example 7 | 0.1 | 0.9 | 88 | 0.05 |
| Comparative Example 8 | 0.2 | 0.8 | 88 | 0.08 |
| Comparative Example 9 | 0.3 | 0.7 | 87 | 0.12 |

Examples 13 to 16

Comparative Examples 10 to 12

A single crystal was grown, using a micro-pull down apparatus as in FIG. 2. Herein used was a single crystal growing apparatus comprising a rhenium crucible having a diameter of 20 mm, a seed holding tool for holding the seed to be kept in contact with the melt flowing out from the fine pore formed through the bottom of the rhenium crucible, a moving mechanism for moving downward the seed holding tool, a moving speed controller for the moving mechanism, and an induction heater for heating the crucible. In addition, an after heater formed of rhenium was arranged. Two or three fine pores each having a diameter of 200 μm were formed through the bottom of the crucible.

Powdery starting materials of $Tb_2O_3$ having a purity of at least 99.9 wt % and $Y_2O_3$ having a purity of at least 99.9 wt % were prepared, and these were weighed in a predetermined molar ratio of $Tb_2O_3/Y_2O_3$. Subsequently, pure water was added to the starting material composition, wet-mixed for 3 hours, and the mixed powder was dewatered and vacuum-dried. Subsequently, the powder was ground, then ethanol and ethylene glycol were added thereto and wet-mixed to be slurry. The slurry mixture was shaped into a columnar compact having a size of 3 mm diameter×50 mm length, using a shaping machine. The shaped compact was sintered in an argon atmosphere at 1,600° C. for 2 hours to give a ceramic sintered compact having a size of 3 mm diameter×50 mm length.

Using a micro-pull down apparatus, the sintered material, as dried according to the above-mentioned method, was set in a crucible. Before heating, the furnace was degassed in vacuum, then argon having a purity of 99.99% was introduced thereinto, whereby the furnace was made to have an inert gas atmosphere. A high-frequency electric power was gradually given to the high-frequency induction heating coil to thereby heat the crucible so that the material in the crucible was completely melted. This state was kept as such for 8 hours so that the melt composition is uniform.

The ceramic sintered compact having a size of 3 mm diameter×50 mm length was gradually elevated at a predetermined speed, and its top was kept in contact with the fine pore of the bottom of the crucible and was thereby well wetted with the melt. Subsequently, with the temperature of the melt kept controlled, the pull down axis was let down to thereby make the crystal grow. At the point when the prepared materials were all crystallized and the melt disappeared, the crystal growth was finished. The grown crystal was, while kept on an after heater, gradually cooled to room temperature.

The obtained crystal was grown under a strong temperature gradient condition, and therefore thermal strain during the growth remained in the crystal; and when cut, the crystal would be cracked. Accordingly, after the crystal growth, the crystal was put in a vacuum heat treatment furnace, and annealed in an argon atmosphere at 1,800° C. for 12 hours to remove the thermal strain.

Thus annealed, the oxide single crystal having a size of 3 mm diameter×30 mm length was trimmed at its both edges using an internal periphery blade cutter, and both edges were polished with an abrasive such as colloidal silica, etc. to thereby mirror-finish them. Thus obtained, the Verdet constant of the cylindrical crystal having a size of 3 mm diameter×25 mm length was determined. The results of Examples and Comparative Examples are shown in Table 4. When the molar ratio of $Tb_2O_3/Y_2O_3$ is at least 0.4/0.6, the Verdet constant was at least 0.18 min/(Oe·cm). This is nearly at least two times the Verdet constant, 0.13 min/(Oe·cm) of a TGG crystal.

TABLE 4

|  | $Tb_2O_3$ mol % | $Y_2O_3$ mol % | Transmittance % | Verdet Constant min/(Oe · cm) |
|---|---|---|---|---|
| Example 13 | 0.4 | 0.6 | 87 | 0.18 |
| Example 14 | 0.5 | 0.5 | 83 | 0.23 |
| Example 15 | 0.6 | 0.4 | 81 | 0.25 |
| Example 16 | 0.7 | 0.3 | 71 | 0.29 |

TABLE 4-continued

|  | $Tb_2O_3$ mol % | $Y_2O_3$ mol % | Transmittance % | Verdet Constant min/(Oe · cm) |
|---|---|---|---|---|
| Comparative Example 10 | 0.1 | 0.9 | 89 | 0.06 |
| Comparative Example 11 | 0.2 | 0.8 | 88 | 0.09 |
| Comparative Example 12 | 0.3 | 0.7 | 88 | 0.13 |

Examples 17 to 21

Comparative Examples 13 to 15

These Examples and Comparative Examples are to demonstrate the production of ceramics (transparent ceramics) according to a hot isotactic pressing method for producing transparent ceramics.

First, powdery starting materials of $Tb_2O_3$ having a high purity of 99.9 wt % and $Y_2O_3$ having a purity of 99.999 wt % were prepared, and these were weighed in a predetermined molar ratio of $Tb_2O_3/Y_2O_3$. The $Tb_2O_3$ powder and the $Y_2O_3$ powder were mixed in a predetermined molar ratio, and the mixed powder was dissolved in an aqueous nitric acid solution having a concentration of 1 mol/l. Aqueous ammonium sulfate solution having a concentration of 1 mol/l was mixed therein, then ultrapure water was added, and the concentration of the solution was controlled. With the resulting aqueous solution kept stirred, an aqueous ammonium hydrogencarbonate solution having a concentration of 0.5 mol/l was dropwise added at a constant addition rate until the system has a pH of 8, and with stirring, this was left at room temperature for 2 days, and thereafter filtered and washed with ultrapure water, and dried at 150° C. for 2 days. The obtained mixed powder was put into an alumina crucible, and calcined in an inert atmosphere such as a nitrogen atmosphere, an argon atmosphere, etc. in an electric furnace at 1,200° C. for 3 hours. The inert atmosphere was employed for preventing the valence of terbium oxide from changing.

100 g of the starting material powder prepared in the above, 50 g of methanol as a solvent, 1 g of polyvinyl alcohol as a binder, 1 g of polyethylene glycol as a plasticizer, and 0.5 g of stearic acid as a lubricant were wet-mixed in a nylon ball mill to be slurry. In this, a predetermined amount, for example, 0.001 to 0.01 parts by weight of a sintering promoter was added to the mixture.

The obtained slurry was processed with a spray drier to give dry spheres. The dry spheres were put into a 5 mmφ mold, primary-shaped therein, and then further shaped according to a cold isotactic press (CIP) method under a pressure of 200 MPa. The shaped compact is degreased at an elevated temperature of 400 to 600° C. Up to 400° C., the compact was heated in air, and at a higher temperature, the compact was heated in an inert atmosphere.

Subsequently, this was sintered in a vacuum furnace at 1,700° C. for 8 to 10 hours. The sintering condition was as follows. Up to 1,200° C., the heating speed was 300° C./hr, and at a higher temperature, the heating speed was 50° C./hr. The vacuum degree was $0.5 \times 10^{-1}$ Pa.

For further increasing the transparency thereof, the treatment was processed according to a hot isotactic press (HIP) method at 1,800° C. and under a pressure of 100 MPa for 10 hours.

The annealed solid solution single crystal having a size of 3 mm diameter×30 mm length was trimmed at their both edges using an internal periphery blade cutter, and both edges were polished with an abrasive such as colloidal silica, etc. to thereby mirror-finish them. Thus obtained, the Verdet constant of the cylindrical crystal having a size of 3 mmφ×25 mm was determined. The results of Examples and Comparative Examples are shown in Table 4. When the molar ratio of $Tb_2O_3/Y_2O_3$ is at least 0.4/0.6, the Verdet constant was at least 0.18 min/(Oe·cm). This is nearly at least two times the Verdet constant, 0.13 min/(Oe·cm) of a TGG crystal.

TABLE 5

|  | $Tb_2O_3$ mol % | $Y_2O_3$ mol % | MgO wt % | Transmittance % | Verdet Constant min/(Oe · cm) |
|---|---|---|---|---|---|
| Example 17 | 0.4 | 0.6 | 0 | 84 | 0.18 |
| Example 18 | 0.5 | 0.5 | 0 | 83 | 0.23 |
| Example 19 | 0.6 | 0.4 | 0 | 84 | 0.25 |
| Example 20 | 0.7 | 0.3 | 0 | 74 | 0.27 |
| Example 21 | 0.7 | 0.3 | 0.001 | 84 | 0.28 |
| Comparative Example 13 | 0.1 | 0.9 | 0 | 85 | 0.06 |
| Comparative Example 14 | 0.2 | 0.8 | 0 | 84 | 0.09 |
| Comparative Example 15 | 0.3 | 0.7 | 0 | 84 | 0.13 |

Examples 22 to 32

In the same manner as in Example 19 except that the sintering promoter was changed while $Tb_2O_3/Y_2O_3=0.4/0.6$ was kept constant as such, the samples were evaluated for the transmittance and the Verdet constant thereof. The results are shown in the following Table.

TABLE 6

|  | $Tb_2O_3$ mol % | $Y_2O_3$ mol % | $Al_2O_3$ part by weight | $GeO_2$ part by weight | $TiO_2$ part by weight | Transmittance % | Verdet Constant min/(Oe · cm) |
|---|---|---|---|---|---|---|---|
| Example 19 | 0.6 | 0.4 | 0 | 0 | 0 | 84 | 0.25 |
| Example 22 | 0.6 | 0.4 | 0.001 | 0 | 0 | 82 | 0.24 |
| Example 23 | 0.6 | 0.4 | 0 | 0.001 | 0 | 83 | 0.24 |
| Example 24 | 0.6 | 0.4 | 0 | 0 | 0.001 | 82 | 0.23 |
| Example 25 | 0.6 | 0.4 | 0.001 | 0.001 | 0.001 | 81 | 0.23 |
| Example 26 | 0.6 | 0.4 | 0.009 | 0 | 0 | 81 | 0.23 |
| Example 27 | 0.6 | 0.4 | 0 | 0.009 | 0 | 80 | 0.22 |
| Example 28 | 0.6 | 0.4 | 0 | 0 | 0.009 | 78 | 0.22 |
| Example 29 | 0.6 | 0.4 | 0.009 | 0.009 | 0.009 | 73 | 0.22 |
| Example 30 | 0.6 | 0.4 | 0.02 | 0 | 0 | 72 | 0.21 |
| Example 31 | 0.6 | 0.4 | 0 | 0.02 | 0 | 71 | 0.21 |
| Example 32 | 0.6 | 0.4 | 0 | 0 | 0.02 | 71 | 0.21 |

Example 33

The produced $Tb_{0.6}Y_{0.4}O_2$ crystal having 5 mmφ was finished to have an outer diameter of 4.5 mmφ, and then sliced with an inner periphery blade slicer. Its both edges were lapped with SiC abrasive grains and polished with colloidal silica, thereby having a final length of 12 mm to give a Faraday rotator. Its length was enough to obtain a rotational angle of 45° at a wavelength of 1.06 μm. The transmittance at a wavelength of 1.06 μm and an optical length of 12 mm was 70%.

Both faces of the Faraday rotator were coated with a non-reflective coat for air.

On the other hand, two polarization beam splitter having a size of 10 mm×10 mm square were prepared to be a polarizer and an analyzer for an optical isolator. Both surfaces of these polarizer and analyzer were coated with a non-reflective coat for air.

The Faraday rotator, the polarizer and the analyzer were built in a metal housing as combined therein. With a laser beam made to pass through the center, the polarizer (or the analyzer) was rotated and regulated so that the reversed direction insertion loss would be the maximum, and thereafter the members were bonded and fixed. In this moment, a permanent magnet was arranged around the outer periphery of the Faraday rotator. The optical device was set in a saturated magnetic field and its optical properties were measured. The reversed direction insertion loss was 43 dB, and the regular direction insertion loss was 0.20 dB. The isolator had a smaller insertion loss as compared with conventional devices, and exhibited high performance as an optical isolator. In addition, as compared with that in conventional devices, the length of the Faraday rotator is short, that is, the isolator is a downsized optical isolator.

DESCRIPTION OF THE REFERENCE NUMERALS

100 Xenon Lamp FZ Apparatus
110 Upper Shaft
112 Lower Shaft
114 Feed Rod
116 Seed Rod
120 Xenon Lamp
130 Oval Mirror
140 Quartz Tube
200 Micro-Pull Down Apparatus
210 Melt
220 Crucible
222 Crucible Supporting Tool
230 Insulating Jacket
240 Quartz Tube
250 Induction Heater
260 Seed Holder
300 Optical Isolator
310 Faraday Rotator
320 Polarizer
330 Analyzer
340 Magnet

What is claimed is:

1. An oxide comprising:
   an oxide represented by Formula (I) as the main component thereof; and
   a metal oxide selected from the group consisting of alkaline earth metal oxides, Group 13 element oxides, Group 14 element oxides and Group 4 element oxides, in an amount of 0.00001 wt % to 0.1 wt %, wherein
   the oxide comprising the oxide represented by Formula (I) and the metal oxide is a solid solution,
   the oxide comprising the oxide represented by Formula (I) and the metal oxide has a Verdet constant at a wavelength of 1.06 μm of at least 0.18 min/(Oe·cm), and
   the oxide comprising the oxide represented by Formula (I) and the metal oxide has a transmittance at a wavelength of 1.06 μm and for an optical length of 3 mm of at least 70%:

$$(Tb_xR_{1-x})_2O_3 \quad (I)$$

wherein x is 0.4≤x≤1.0; R includes at least one element selected from the group consisting of scandium, yttrium, lanthanum, europium, gadolinium, ytterbium, holmium and lutetium, and
an amount of the oxide represented by Formula (I) is at least 80 wt %.

2. The oxide as claimed in claim 1, wherein in Formula (I), R is a single element selected from the group consisting of scandium, yttrium, lanthanum, europium, gadolinium, ytterbium, holmium and lutetium.

3. The oxide as claimed in claim 1, wherein the oxide comprising the oxide represented by Formula (I) and the metal oxide is a single crystal.

4. The oxide as claimed in claim 3, wherein the metal oxide contains an alkaline earth metal oxide in an amount of 0.0001 wt % to 0.1 wt %.

5. The oxide as claimed in claim 3 or 4, wherein the oxide comprising the oxide represented by Formula (I) and the metal oxide is produced by a production method selected from the group consisting of a floating zone melt method, a micro-pull down method, a pull up method, a skull melt method, and a Bridgman method.

6. The oxide as claimed in claim 1, wherein the oxide comprising the oxide represented by Formula (I) and the metal oxide is a ceramic.

7. A magneto-optical device comprising the oxide of claim 1.

8. The magneto-optical device as claimed in claim 7, comprising:
   the oxide comprising the oxide represented by Formula (I) and the metal oxide as a Faraday rotator; and
   a polarizing material arranged before and after the Faraday rotator, wherein
   the magneto-optical device is an optical isolator for a wavelength range of from 0.9 μm to 1.1 μm.

9. The oxide as claimed in claim 1, wherein the amount of the oxide represented by Formula (I) is at least 99 wt %.

10. The oxide as claimed in claim 1, wherein x is 0.4≤x≤0.8 in Formula (I).

11. A magneto-optical device comprising:
    an oxide as a Faraday rotator; and
    a polarizing material arranged before and after the Faraday rotator, wherein
    the magneto-optical device is an optical isolator for a wavelength range of from 0.9 μm to 1.1 μm, and
    the oxide comprises:
    an oxide represented by Formula (I) as the main component thereof; and
    a metal oxide selected from the group consisting of alkaline earth metal oxides, Group 13 element oxides, Group 14 element oxides and Group 4 element oxides, in an amount of 0.00001 wt % to 0.1 wt %, wherein
    the oxide comprising the oxide represented by Formula (I) and the metal oxide is a solid solution, the oxide comprising the oxide represented by Formula (I) and the metal oxide has a Verdet constant at a wavelength of 1.06 μm of at least 0.18 min/(Oe·cm), and the oxide comprising the oxide represented by Formula (I) and the metal oxide has a transmittance at a wavelength of 1.06 μm and for an optical length of 3 mm of at least 70%:

$$(Tb_xR_{1-x})_2O_3 \quad (I)$$

wherein x is 0.4≤x≤1.0; R includes at least one element selected from the group consisting of scandium, yttrium, lanthanum, europium, gadolinium, ytterbium, holmium and lutetium.

12. A magneto-optical device comprising:

an oxide as a Faraday rotator; and a polarizing material arranged before and after the Faraday rotator, wherein the magneto-optical device is an optical isolator for a wavelength range of from 0.9 μm to 1.1 μm, and the oxide comprises an oxide represented by Formula (I) as the main component thereof, wherein the oxide comprising the oxide represented by Formula (I) has a Verdet constant at a wavelength of 1.06 vim of at least 0.18 min/(Oe·cm), and the oxide comprising the oxide represented by Formula (I) has a transmittance at a wavelength of 1.06 μm and for an optical length of 3 mm of at least 70%:

$$(Tb_xR_{1-x})_2O_3 \quad (I)$$

wherein x is 0.4≤x≤1.0; R includes at least one element selected from the group consisting of scandium, yttrium, lanthanum, europium, gadolinium, ytterbium, holmium and lutetium.

* * * * *